United States Patent
Tanaka et al.

(10) Patent No.: US 10,520,137 B2
(45) Date of Patent: Dec. 31, 2019

(54) FLOW CHANNEL STRUCTURE

(71) Applicant: Kabushiki Kaisha Toshiba, Minato-ku (JP)

(72) Inventors: Masayuki Tanaka, Yokohama (JP); Hiroshi Ohno, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 55 days.

(21) Appl. No.: 15/556,195

(22) PCT Filed: Sep. 10, 2015

(86) PCT No.: PCT/JP2015/075771
§ 371 (c)(1),
(2) Date: Sep. 6, 2017

(87) PCT Pub. No.: WO2016/147444
PCT Pub. Date: Sep. 22, 2016

(65) Prior Publication Data
US 2018/0045374 A1  Feb. 15, 2018

(30) Foreign Application Priority Data
Mar. 18, 2015  (JP) .................. 2015-055138

(51) Int. Cl.
*F17D 1/04* (2006.01)
*F17D 1/00* (2006.01)
(Continued)

(52) U.S. Cl.
CPC .......... *F17D 1/04* (2013.01); *C23C 16/45563* (2013.01); *F16L 43/00* (2013.01);
(Continued)

(58) Field of Classification Search
CPC ......... Y10T 137/85938; Y10T 137/877; F16L 41/02; F16L 41/023; F16L 43/005;
(Continued)

(56) References Cited

U.S. PATENT DOCUMENTS 1,825,103 A   9/1931  Stacey, Jr.
2,163,591 A * 6/1939  Deverall .................. F25B 39/02
                                               137/109
(Continued)

FOREIGN PATENT DOCUMENTS

JP   53-105019 U   8/1978
JP   60-241590 A   11/1985
(Continued)

OTHER PUBLICATIONS

International Search Report dated Nov. 24, 2015 in PCT/JP2015/075771 filed Sep. 10, 2015.

*Primary Examiner* — Reinaldo Sanchez-Medina
*Assistant Examiner* — Nicole Gardner
(74) *Attorney, Agent, or Firm* — Oblon, McClelland, Maier & Neustadt, L.L.P.

(57) ABSTRACT

A flow channel structure includes a member including a flow channel. The flow channel includes a first part, second parts, and connections. The first part extends in a first direction. The connections connect the first part and the second parts. The connections include a first bend and a second bend. The first bend arcuately extends with a first curvature and a central angle of greater than 90 degrees. The first bend has a first end connected to the second parts, and a second end. The second bend arcuately extends with a second curvature. The second bend has a third end connected to the second end. A tangent to the first end extends in a same direction as the second parts extend. A tangent to the second end is equal to a tangent to the third end.

9 Claims, 14 Drawing Sheets

(51) Int. Cl.
*F16L 43/00* (2006.01)
*C23C 16/455* (2006.01)
*F17D 1/08* (2006.01)
*B05B 9/04* (2006.01)
*F16L 41/02* (2006.01)

(52) U.S. Cl.
CPC ................ *F17D 1/00* (2013.01); *F17D 1/08* (2013.01); *B05B 9/0403* (2013.01); *F16L 41/02* (2013.01)

(58) Field of Classification Search
CPC .. B01F 5/0647; B01F 15/0264; B01F 5/0653; F17D 1/04
See application file for complete search history.

(56) References Cited

U.S. PATENT DOCUMENTS

| | | | | |
|---|---|---|---|---|
| 2,382,871 | A * | 8/1945 | Gerhold | B01F 3/0853 261/75 |
| 4,222,671 | A * | 9/1980 | Gilmore | B01F 5/0604 366/337 |
| 4,410,281 | A * | 10/1983 | Crookes | B01F 5/0646 138/178 |
| 4,572,435 | A * | 2/1986 | Thompson | B05B 1/14 137/561 A |
| 5,992,453 | A | 11/1999 | Zimmer | |
| 6,331,072 | B1 * | 12/2001 | Schierholz | B01F 5/0646 138/177 |
| 6,550,750 | B1 * | 4/2003 | Kalkstein | B01F 3/04446 239/433 |
| 7,041,218 | B1 * | 5/2006 | Liles | B01F 5/0646 209/434 |
| 7,160,025 | B2 * | 1/2007 | Ji | B01F 5/0646 366/341 |
| 9,375,692 | B2 * | 6/2016 | Greter | B05C 17/00593 |
| 2004/0094090 | A1 * | 5/2004 | Stadel | C23C 16/45563 118/715 |
| 2006/0090701 | A1 | 5/2006 | Choi | |
| 2007/0246106 | A1 * | 10/2007 | Tonkovich | B01F 3/0807 137/561 A |
| 2011/0128814 | A1 * | 6/2011 | Hanada | B01F 5/0614 366/339 |
| 2013/0306041 | A1 | 11/2013 | Koga | |

FOREIGN PATENT DOCUMENTS

| | | |
|---|---|---|
| JP | 9-112945 A | 5/1997 |
| JP | 2005-299545 A | 10/2005 |
| JP | 2006-131985 A | 5/2006 |
| JP | 2013-241864 A | 12/2013 |
| JP | 2014-12239 A | 1/2014 |

* cited by examiner

FLOW CHANNEL STRUCTURE

CROSS-REFERENCE TO RELATED APPLICATIONS

This application is national stage application of International Application No. PCT/JP2015/075771, filed Sep. 10, 2015, which designates the United States, incorporated herein by reference, and which is based upon and claims the benefit of priority from Japanese Patent Application No. 2015-055138, filed Mar. 18, 2015, the entire contents of each of which are incorporated herein by reference.

FIELD embodiments described herein relates generally to a flow channel structure.

BACKGROUND

A flow channel including bifurcations in midway is known, for example. In the flow channel, the upstream and downstream sides of the bifurcations extend substantially in the same direction, but the upstream and downstream sides of the bifurcations are shifted in position from each other in a direction perpendicular to the same direction.

For example, when a fluid flows from upstream to downstream in the above-described flow channel, the fluid may become uneven in the shifted direction from upstream to downstream.

DETAILED DESCRIPTION

According to one embodiment, flow channel structure includes a member provided with a flow channel. The flow channel includes a first part, second parts and connections. The first part extends in a first direction. The second parts have a same channel length. Each of the connections connects the first part and a corresponding one of the second parts, and includes a first bend and a second bend. The first bend arcuately extends with a first curvature and a central angle of greater than 90 degrees, and has a first end connected to the corresponding one of the second parts and a second end opposite to the first end. The second bend arcuately extends with a second curvature, and has a third end connected to the second end of the first bend. A tangent to the first end of the first bend extends in a same direction as the corresponding one of the second parts extends. A tangent to the second end of the first bend is equal to a tangent to the third end of the second bend. The connections have a same channel length.

Figure 1:
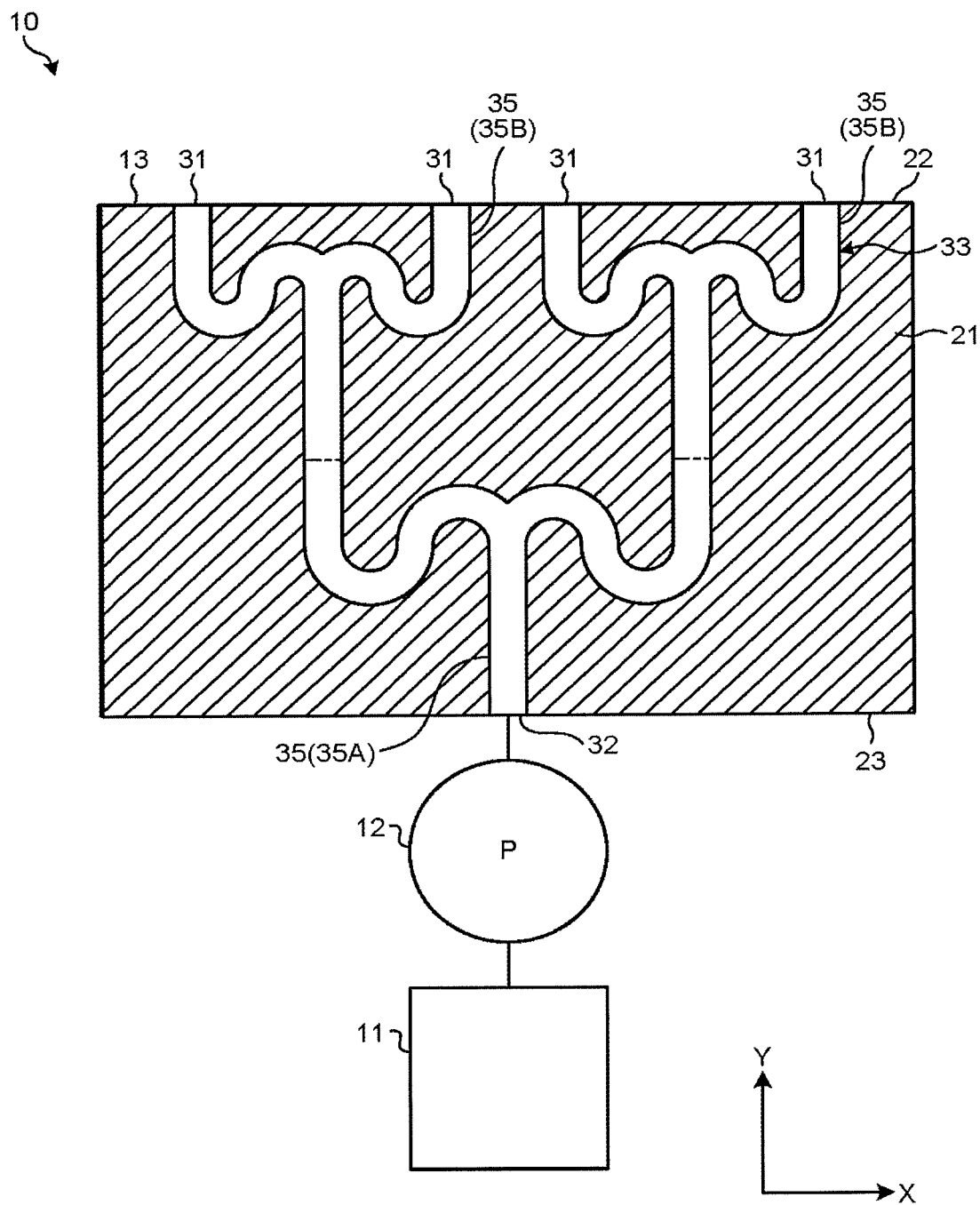
FIG. 1 is a schematic cross-sectional view of a treatment apparatus according to a first embodiment.
Figure 2:
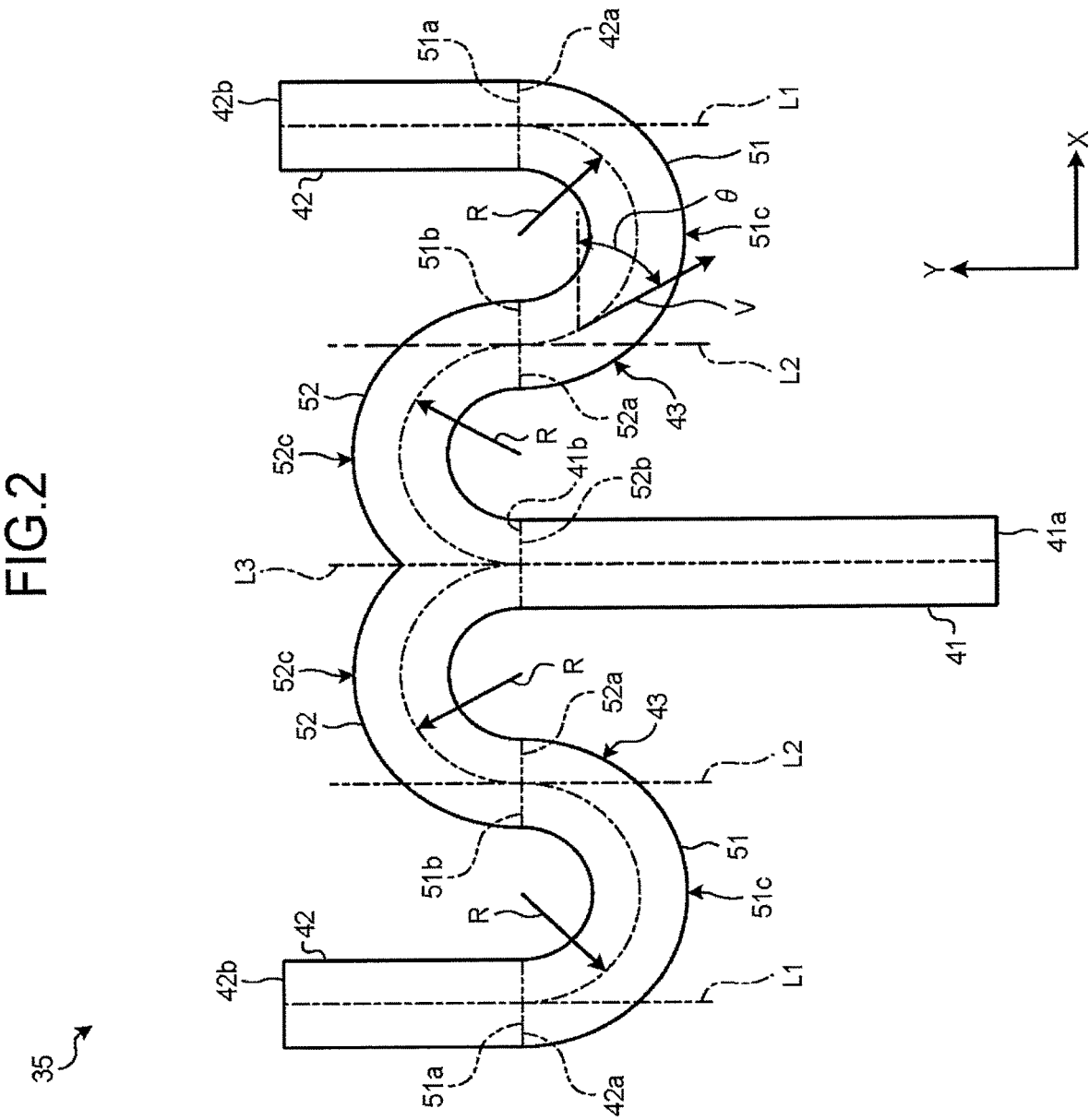
FIG. 2 is a plan view of a bifurcation according to the first embodiment.
Figure 3:
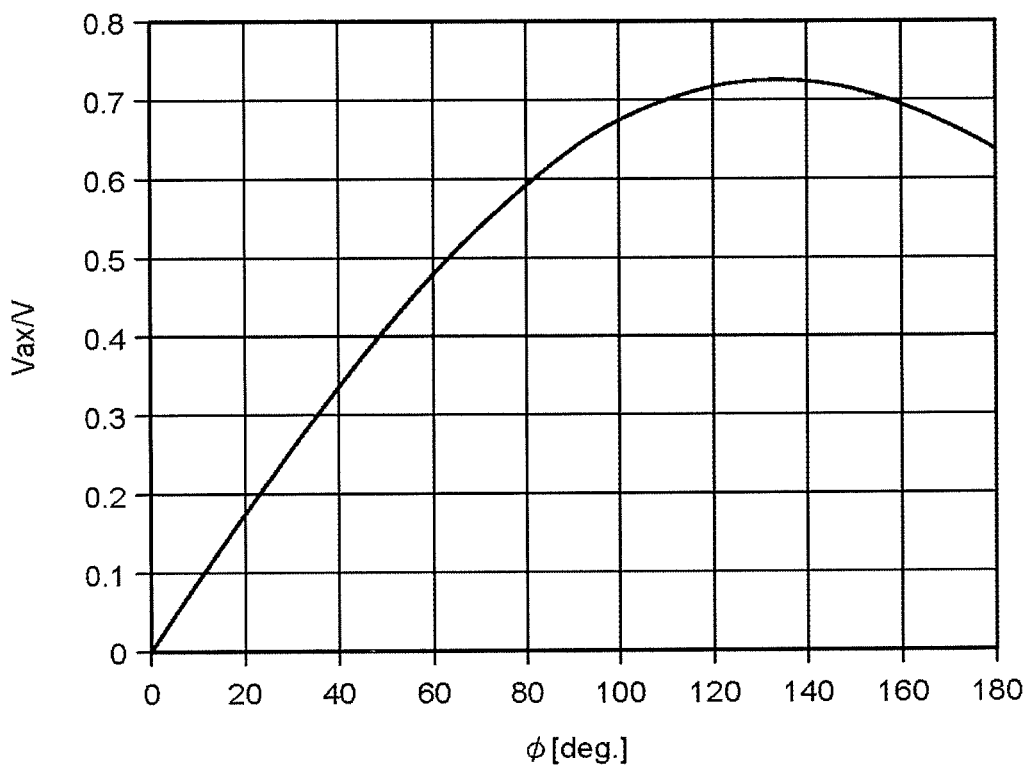
FIG. 3 is a graph illustrating an exemplary relation between Vax and φ in the first embodiment.

The following will describe a first embodiment with reference to FIGS. 1 to 3. Elements and descriptions thereof in the embodiments below may be expressed in different ways, which does not exclude any other expression not used herein to express these embodiments and descriptions thereof. Furthermore, some elements and descriptions thereof may be expressed herein with no alternative explicitly mentioned, which does not exclude any other expression not used herein to express these embodiments and descriptions thereof.

FIG. 1 is a schematic cross-sectional view of a treatment apparatus 10 according to a first embodiment. The treatment apparatus 10 is exemplified by, but should not be limited to, an apparatus for injecting a fluid such as a gas. The treatment apparatus 10 may, for example, be an apparatus for suctioning a fluid.

As illustrated in FIG. 1, the treatment apparatus 10 includes a tank 11, a pump 12, and a nozzle 13. The pump 12 may be referred to as, for example, a feeder. The nozzle 13 is an example of a flow channel structure and may be referred to also as, for example, an injector, a suction unit, a structure, and a component.

As illustrated in the drawings, an X-axis, a Y-axis, and a Z-axis are defined in this description. The X-axis, the Y-axis, and the Z-axis are orthogonal to each other. The X-axis lies along a width of the nozzle 13. The Y-axis lies along a depth (length) of the nozzle 13. The Z-axis lies along a thickness of the nozzle 13.

The tank 11 contains, for example, a gas such as nitrogen. The nitrogen is, however, illustrative only and the tank 11 may contain any other type of gas, or even any other fluid such as a liquid. The tank 11 is connected with the pump 12.

The pump 12 supplies the gas to the nozzle 13 from the tank 11. The function of the pump 12 is not limited to the foregoing. For example, the pump 12 may supply a gas to the nozzle 13 from a treatment chamber (chamber) provided with the nozzle 13. Alternatively, the pump 12 may supply ambient air to the nozzle 13. Still alternatively, the pump 12 may draw a fluid from the nozzle 13.

The nozzle 13 includes a base 21. The base 21 is an example of a member and may be referred to also as, for example, a conduit or a component. The base 21 has a substantially rectangular parallelepiped block shape. The form of the base 21 is illustrative only and the base 21 may have, for example, a pipe-like shape.

The base 21 has a first face 22 and a second face 23. The first and second faces 22 and 23 are both substantially flat. The first face 22 faces in a positive Y-axis direction (hereinafter referred to as a discharge direction). The orientation of the first face is normal to the first face 22. Each of the positive Y-axis direction and the discharge direction is an example of a first direction. The second face 23 is opposite to the first face 22 and faces in a negative Y-axis direction (hereinafter referred to as a suction direction) that is opposite to the discharge direction. Specifically, the discharge direction is a direction from the second face 23 to the first face 22.

The base 21 is provided with first openings 31, a second opening 32 and a flow channel 33. The first and second openings 31 and 32 may be referred to also as, for example, ends, orifices, apertures, outlets, or inlets. The flow channel 33 may be referred to also as, for example, a conduit, a duct, or an aperture.

The first openings 31 are disposed in the first face 22 of the base 21. The first openings 31 are equally spaced apart in, for example, X-axis direction. The arrangement of the first openings 31 is illustrative only. The first openings 31 open to, for example, a chamber in the treatment apparatus 10.

The second opening 32 is disposed in the second face 23 of the base 21. The second opening 32 is connected to the pump 12 through, for example, a pipe. Thus, the pump 12 can supply a gas from the tank 11 to the second opening 32.

The second opening 32 is disposed, for example, at a central portion between the two outermost first openings 31 in the X-axis direction. The disposition of the second opening 32 is, however, illustrative only.

The flow channel 33 is provided inside the base 21. The flow channel 33 connects the first openings 31 and the second opening 32. That is, one end of the flow channel 33 is the first openings 31 and the other end is the second opening 32.

The flow channel 33 includes two or more bifurcations 35. In the following, the bifurcation 35 connected to the second opening 32 may be referred to as a bifurcation 35A. The bifurcation 35 connected to the first openings 31 may be referred to as bifurcation 35B. In FIG. 1, the bifurcation 35A and the bifurcations 35B are delimited by the dash-double-dot line.

The gas supplied to the flow channel 33 from the second opening 32 is divided into two at the bifurcation 35A and further divided into two at the bifurcations 35B before being discharged from the first openings 31. Lengths of the channel from the second opening 32 to the first openings 31 are identical to each other. The lengths of the channel from the second opening 32 to the first openings 31 may be slightly different from each other FIG. 2 is a plan view of one bifurcation 35 according to the first embodiment. The bifurcation 35 includes one first part 41, two second parts 42, and two connections 43. The numbers of the second parts 42 and the connections 43 are illustrative only and may be three or more.

The two second parts 42 have substantially the same shape. The two connections 43 also have substantially the same shape. Because of this, the second part 42 and the connection 43 on one side are rotationally symmetric by 180 degrees (mirror symmetric) with respect to the second part 42 and the connection 43 on the other side. The configurations of the second parts 42 and the connections 43 are illustrative only and may be rotationally symmetric by a different angle or may have different shapes from each other.

The first part 41, the second parts 42, and the connections 43 have substantially the same cross section. For example, the first part 41, the second parts 42, and the connections 43 have a circular cross section having the same size. The cross sectional shape of the first part 41, the second parts 42, and the connections 43 is illustrative only and the first part 41, the second parts 42, and the connections 43 may have any other cross sectional shape such as, for example, an ellipse extending in Z-axis direction.

The first part 41 is a linear part extending in the discharge direction. The first part 41 may include a curve or a tilt with respect to the discharge direction. The first part 41 has a first inlet end 41a and a first outlet end 41b.

The first inlet end 41a is the end of the first part 41 in the suction direction. The first inlet end 41a of the bifurcation 35A is connected to the second opening 32 in FIG. 1. The first inlet end 41a of each bifurcation 35B is connected to the bifurcation 35A.

The first outlet end 41b is the end of the first part 41 in the discharge direction. The first outlet end 41b is on the opposite side of the first inlet end 41a. The first outlet end 41b is connected to two connections 43. That is, the two connections 43 extend from the first outlet end 41b.

The second parts 42 are linear parts extending in the discharge direction. Specifically, the second parts 42 extend substantially in parallel with the first part 41. The second parts 42 may each include a curve or a tilt with respect to the discharge direction.

In the present embodiment, the first part 41 and the two second parts 42 are spaced apart from each other in the X-axis direction. The first part 41 lie between the two second parts 42 in the X-axis direction. A distance between the second part 42 on one side and the first part 41 is equal to a distance between the second part 42 on the other side and the first part 41 in the X-axis direction. The dispositions of the first part 41 and the second parts 42 are illustrative only. The second parts 42 each have a second inlet end 42a and a second outlet end 42b.

The second inlet end 42a is the end of the second part 42 in the suction direction. The second inlet end 42a is connected to a corresponding connection 43. That is, the connection 43 extends from the second inlet end 42a. Specifically, the connections 43 each connect the first outlet end 41b of the first part 41 and the second inlet end 42a of the corresponding second part 42.

The second outlet end 42b is the end of the second part 42 in the discharge direction. The second outlet end 42b is on the opposite side of the second inlet end 42a. The second outlet end 42b of the bifurcation 35A is connected to the first inlet end 41a of the first part 41 of the bifurcation 35B. The second outlet end 42b of the bifurcation 35B is connected to the corresponding first opening 31.

The second outlet end 42b of the second part 42 is further in position in the discharge direction than the first outlet end 41b of the first part 41. The second outlet end 42b of the second part 42 may be at the same position as the first outlet end 41b of the first part 41 in the Y-axis direction, or at a position further in the suction direction than the first outlet end 41b of the first part 41.

The channel lengths of the two second parts 42 are equal to each other. Specifically, a distance between the second inlet end 42a and the second outlet end 42b of the second part 42 on one side is equal to a distance between the second inlet end 42a and the second outlet end 42b of the second part 42 on the other side. The two second parts 42 may have slightly different channel lengths from each other.

As described above, the connections 43 each lie between the first outlet end 41b of the first part 41 and the second inlet end 42a of the corresponding second part 42. The connections 43 each include a first bend 51 and a second bend 52. The first and second bends 51 and 52 may each be referred to also as, for example, a smoother, a bypass, an arc, a curve, or a part.

As illustrated in FIG. 2, the first bend is an arcuately extending portion having a radius of R. That is, the first bend 51 is an arcuately extending portion having a curvature of 1/R. 1/R is an example of a first curvature. In the present embodiment, the radius and the curvature of the first bend 51 represent the radius and the curvature of the center of a cross section of the first bend 51 indicated by the dash-single-dot line.

The first bend 51 has a first connection end 51a and a second connection end 51b. The first connection end 51a is an example of a first end. The second connection end 51b is an example of a second end.

The first connection end 51a is connected to the second inlet end 42a of the second part 42. A tangent L1 to the first connection end 51a of the first bend 51 extends in the discharge direction. Specifically, the tangent L1 to the first connection end 51a of the first bend 51, and the second part 42 extend in the same direction (discharge direction).

The second connection end 51b is on the opposite side of the first connection end 51a. A tangent L2 to the second connection end 51b of the first bend 51 extends in the discharge direction. Specifically, the tangent L2 to the second connection end 51b of the first bend 51 and the tangent L1 to the first connection end 51a of the first bend 51 extend in the same direction.

The first bend 51 arcuately extends with a central angle of greater than 90 degrees. In the present embodiment, the first bend 51 arcuately extends with a central angle of 180 degrees. As a result, the first connection end 51a and the second connection end 51b face substantially in the same direction. Additionally, the tangent L1 and the tangent L2 extend substantially in parallel with each other.

The first bend 51 extends, in the X-axis direction, from the second inlet end 42a of the second part 42 toward the first part 41. The extending direction of the first bend 51 in the present embodiment is on an X-Y plane. The extending direction of the first bend 51 is illustrative only and it may extend in the Z-axis direction.

The second bend 52 is an arcuately extending portion having a radius of R. That is, the second bend 52 is an arcuately extending portion having a curvature of 1/R. 1/R is an example of a second curvature. In the present embodiment, the radius and the curvature of the second bend 52 represent the radius and the curvature of the center of a cross section of the second bend 52 indicated by the dash-single-dot line.

In the present embodiment, the radius R of the first bend 51 is equal to the radius R of the second bend 52. As a result, the curvature 1/R of the first bend 51 is equal to the curvature 1/R of the second bend 52. The curvature of the first bend 51 may differ from the curvature of the second bend 52. For example, the curvature of the first bend 51 may be smaller than the curvature of the second bend 52.

The second bend 52 has a third connection end 52a and a fourth connection end 52b. The third connection end 52a is an example of a third end. The fourth connection end 52b is an example of a fourth end.

The third connection end 52a is connected to the second connection end 51b of the first bend 51. The third connection end 52a of the second bend 52 faces in the suction direction. Thus, the tangent L2 to the second connection end 51b of the first bend 51 is identical to the tangent L2 to the third connection end 52a of the second bend 52.

The fourth connection end 52b is on the opposite side of the third connection end 52a. The fourth connection end 52b is connected to the first outlet end 41b of the first part 41. A tangent L3 to the fourth connection end 52b of the second bend 52 extends in the discharge direction. Specifically, the extending direction of the tangent L3 to the fourth connection end 52b of the second bend 52 is the same as the extending direction of the first part 41 (discharge direction).

The two second bends 52 both extend from the first outlet end 41b of the first part 41. Thus, the two second bends 52 have the common fourth connection end 52b and peripheral parts thereof. In other words, the two second bends 52 are connected to the first part 41 and to each other.

The second bend 52 arcuately extends with a central angle of greater than 90 degrees. In the present embodiment, the second bend 52 arcuately extends with a central angle of 180 degrees. As a result, the third connection end 52a and the fourth connection end 52b face substantially in the same direction. Additionally, the tangent L2 and the tangent L3 extend substantially in parallel with each other.

The second bend 52 extends from the second connection end 51b of the first bend 51 toward the first part 41 in the X-axis direction. The second bend 52 in the present embodiment extends on the X-Y plane. The extending direction of the second bend 52 is illustrative only and it may extend in the Z-axis direction.

The first bend 51 has a suction-side end 51c. The suction-side end 51c is an end of the first bend 51 in the suction direction. That is, the suction-side end 51c represents a farthest part of the first bend 51 in the suction direction.

The second bend 52 has a discharge-side end 52c. The discharge-side end 52c is an end of the second bend 52 in the discharge direction. That is, the discharge-side end 52c represents a farthest part of the second bend 52 in the discharge direction.

In the connection 43, the discharge-side end 52c of the second bend 52 is farther than the suction-side end 51c of the first bend 51 in the discharge direction. Thus, the passage of the connection 43 from the first outlet end 41b of the first part 41 to the second inlet end 42a of the second part 42 includes, in the Y-axis direction, parts extending in the discharge direction and a part extending in the suction direction. For example, the part from the first outlet end 41b of the first part 41 to the discharge-side end 52c of the second bend 52, and the part from the suction-side end 51c of the first bend 51 to the second inlet end 42a of the second part 42 extend in the discharge direction along the Y-axis. Additionally, the part from the discharge-side end 52c the second bend 52 to the suction-side end 51c of the first bend 51 extends in the suction direction along the Y-axis.

The two connections 43 have the same channel length. Specifically, the channel length between the first connection end 51a of the first bend 51 and the fourth connection end 52b of the second bend 52 of one connection 43 is equal to the channel length between the first connection end 51a of the first bend 51 and the fourth connection end 52b of the second bend 52 of the other connection 43. The two connections 43 may have slightly different channel lengths from each other.

As illustrated in FIG. 1, the bifurcation 35A differs in shape from the bifurcations 35B. For example, the first and second bends 51 and 52 of the bifurcation 35A have a curvature different from the curvature of the first and second bends 51 and 52 of the bifurcations 35B. The bifurcation 35A may be substantially identical or similar in shape to the bifurcations 35B. The two bifurcations 35B have substantially the same shape. The two bifurcations 35B may have different shapes from each other.

With the two bifurcations 35B of different shapes from each other, the channel lengths from the first inlet end 41a of the first part 41 to the second outlet ends 42b of the respective second parts 42 are equal to one another. In addition, the curvature and the central angle of the first bends 51 of one bifurcation 35B are equal to the curvature and the central angle of the first bends 51 of the other bifurcation 35B. The curvature and the central angle of the second bends 52 of one bifurcation 35B are equal to the curvature and the central angle of the second bends 52 of the other bifurcation 35B.

The nozzle 13 as above is additively manufactured by, for example, a 3D printer. The nozzle 13 is formed from various materials, such as a synthetic resin and metal. A material resistant to a fluid (gas) supplied by the nozzle 13 is selectively used as the material of the nozzle 13.

The 3D printer, for example, repeatedly forms and solidifies layers of material in the Z-axis direction to form the nozzle 13. The flow channel 33 may be processed by cutting in the middle of adding layers of the nozzle 13. Faces of the flow channel 33 except for downward faces may, for example, be processed by cutting in the middle of adding layers of the nozzle 13.

The nozzle 13 may be formed by any other method than the additive manufacturing. The nozzle 13 may be formed by, for example, joining together members each including a part of the flow channel 33 formed by cutting. Alternatively, bent pipes may be connected with each other to form the nozzle 13.

The treatment apparatus 10 described above discharges a gas from the nozzle 13 as below, for example. The following description is illustrative only and the gas discharging method of the treatment apparatus 10 and the flow of gas are illustrative only and not limiting.

The gas contained in the tank 11 illustrated in FIG. 1 is supplied to the flow channel 33 of the nozzle 13 by the pump 12. The gas flows into the first inlet end 41a of the first part 41 of the bifurcation 35A by way of the second opening 32 in the nozzle 13.

The gas flows from the first inlet end 41a of the first part 41 illustrated in FIG. 2 to the first outlet end 41b. The gas flows from the first outlet end 41b into the fourth connection ends of the two second bends 52 that are connected with the first outlet end 41b. Specifically, the gas flowing channel of the bifurcation 35A is bifurcated by the two second bends 52.

The first part 41 extends in the same direction as the tangent L3 to the fourth connection end 52b of the second bend 52. The gas thus smoothly flows from the first part 41 into the two second bends 52. In other words, the gas is less likely to collide with the inner face of the flow channel 33 at the connection between the first part 41 and the second bends 52, and can flow along the second bend 52. This can inhibit an increased pressure loss of the gas at the connection between the first part 41 and the second bends 52.

The gas flows from the fourth connection ends 52b of the second bends 52 to the third connection ends 52a. From the fourth connection ends 52b to the discharge-side ends 52c of the second bends 52, the gas moves in the discharge direction as moving in the X-axis direction. From the discharge-side ends 52c to the third connection ends 52a, the gas further moves in the suction direction (i.e., a negative Y-axis direction), as moving in the X-axis direction.

The gas flows from the third connection ends 52a of the second bends 52 into the second connection ends 51b of the first bends 51. The gas flows from the second connection ends 51b of the first bends 51 toward the first connection ends 51a. From the second connection ends 51b to the suction-side ends 51c of the first bends 51, the gas moves in the suction direction as moving in the X-axis direction. From the suction side end 51c toward the first connection end 51a, the gas moves in the discharge direction as moving in the X-axis direction.

The gas flows from the first connection ends 51a of the first bends 51 into the second inlet ends 42a of the second parts 42. The gas further flows from the second inlet ends 42a of the second parts 42 to the second outlet ends 42b. The gas flows from the second outlet ends 42b of the second parts 42 the bifurcation 35A into the fir inlet ends 41a of the first parts 41 of the bifurcations 35B.

In the bifurcations 35B, the gas from the first part 41 is bifurcated into the two second bends 52, flowing toward the second parts 42. The gas is discharged to the outside of the nozzle 13 by way of the first openings 31 connected to the second outlet ends 42b of the second parts 42.

Let V denote an average flow velocity of the gas flowing through the flow channel 33 as illustrated in FIG. 2. A component Vx of the gas at a certain point, flowing through the connection 43 in the X-axis direction at the average flow velocity V, can be obtained by $$Vx = V \cdot \cos \theta$$

where $\theta$ is an angle of a tangent to the certain point of the connection 43 with respect to the X-axis. The component Vx varies, flowing from the first outlet end 41b of the first part 41 to the second inlet ends 42a of the second parts 42.

For example, the tangents L1 and L2 to the first connection ends 51a and the second connection ends 51b of the first bends 51 extend in the Y-axis direction. Similarly, the tangents L2 and L3 to the third connection ends 52a and the fourth connection ends 52b of the second bends 52 extend in the Y-axis direction. Thus, the component Vx flows at the lowest speed, that is, Vx=0 at the first and second connection ends 51a and 51b of the first bends 51 and at the third and fourth connection ends 52a and 52b of the second bends 52.

Meanwhile, at the suction-side ends 51c the tangents to the first bends 51 extend in the X-axis direction. Similarly, at the discharge-side ends 52c the tangents to the second bends 52 extend in the X-axis direction. Thus, the component Vx flows at the highest speed, that is, Vx=V at the suction-side ends 51c of the first bends 51 and at the discharge-side ends 52c of the second bends 52.

Through the connections 43, the gas flows from the first outlet end 41b of the first part 41 toward the second inlet ends 42a of the second parts 42 that are spaced apart from the first part 41 in the X-axis direction. That is, passing through the connections 43, the gas move generally in the X-axis direction. As described above, however, passing through the connections 43 in the X-axis direction, the component Vx of the gas varies. For example, the component Vx decreases as the gas moves from the discharge-side ends 52c of the second bends 52 toward the third connection ends 52a. Furthermore, the component Vx decreases as the gas moves from the suction-side ends 51c of the first bends 51 toward the first connection ends 51a.

The maximum value of the component Vx is that Vx=V, at which the gas exerts a maximum inertial force in the X-axis direction. As described above, however, passing through the connections 43, the component Vx of the gas decreases to smaller than the maximum value, resulting in a reduced inertial force. In other words, the X-axis directional inertial force of the gas passing through the connections 43 is unlikely to increase. As a result, flowing into the second parts 42, the gas becomes distributed substantially uniformly in the X-axis direction That is, the unevenness of the flow of the gas in the second part 42 can be prevented.

For example, the unevenness of the gas in the X-axis direction of the second parts 42 of the bifurcation 35A may result in unevenness in the amount of gas bifurcated at the second bends 52 of the bifurcations 35B. This may cause fluctuations in the discharge amount of gas from each of the first openings 31. Also, the unevenness of the gas in the X-axis direction of the second parts 42 of the bifurcations 35B may result in the discharge of the gas from each of the first openings 31 at a tilt relative to the discharge direction.

As described above, the nozzle 13 in the present embodiment prevents the unevenness in the flow of the gas in the second parts 42. This reduces fluctuations in the discharge amount of the gas from each of the first openings 31, and inhibits the gas from being discharged from each of the first openings 31 at a tilt relative to the discharge direction.

In the treatment apparatus 10 according to the first embodiment, the connections 43 connect the first part 41 and the second parts 42 that extend in the discharge direction. The tangent L1 to the first connection end 51a of the first bend 51 of the connection 43 connected to the second part 42 extends in the discharge direction as with the second part 42. The tangent L2 to the third connection end 52a of the second bend 52 connected to the second connection end 51b of the first bend 51 is identical to the tangent L2 to the second connection end 51b. Thereby, flowing from the second bends 52 to the second parts 42 via the first bends 51, the increase in the inertial force acting on the flow of the gas orthogonally to the discharge direction (that is, the X-axis direction) and pressure loss of the gas can be inhibited. Thus, the flow of the gas from the second parts 42 is prevented from becoming uneven, which reduces variations in the flow rate of the gas bifurcated at the bifurcations 35B and makes it possible to discharge the gas straight in the discharge direction from the second parts 42 of the bifurcations 35B.

The first bends 51 arcuately extend with a central angle of greater than 90 degrees. Because of this, the flowing direction of the gas from the second connection ends 51b to the first bends 51 (the extending direction of the tangent L2 to the second connection end 51b) is shifted to intersect a direction orthogonal to the discharge direction (X-axis direction). Further, a longer channel length of the first bends 51 can be ensured. This reduces the inertial force of the gas in the X-axis direction and reduces the unevenness of the gas flowing in the X-axis direction through the first bends 51. Let $\phi$ be the central angle of the first bends 51, for example. Then, the X-axis directional component of the flow of the gas in the first bends 51 at the average flow velocity is expressed by $V \cdot \cos(\phi - 90°)$ and is lower in velocity than the average flow velocity V. Along with an increase in $\phi$ from 0°, the component of the flow of the gas orthogonal to the discharge direction increases. This component starts decelerating when $\phi$ exceeds 90°. That is, with the value of $\phi$ exceeding 90°, the inertial force of the gas decreases.

In the present embodiment, $\phi = 180°$ is defined, so that when $V \cdot \cos(\phi - 90°) = 0$ holds, the X-axis directional component of the flow of the gas into the first bends 51 at the average flow velocity is reduced to a smallest amount. Thus, the unevenness of the flow of the gas from the second parts 42 is prevented.

The foregoing will be elaborated with reference to FIG. 3. A time average Vax of the flow velocity of the gas in the X-axis direction from the time at which the gas flows into the first bends 51 from the second connection ends 51b to the time at which the gas passes the position on the first bend 51 at the central angle $\phi$ is represented by the following expression:

$$Vax = V \frac{1 - \cos\phi}{\phi} \quad (1)$$

The smaller the value of Vax, the smaller the inertial force of the gas in the X-axis direction.

FIG. 3 is a graph illustrating an exemplary relation between Vax and $\phi$ in the first embodiment. The relation between Vax and $\phi$ is not limited to the one in the graph of FIG. 3. In FIG. 3, the abscissa represents the central angle $\phi$. The ordinate in FIG. 3 represents the value obtained by dividing, by the average gas flow velocity V, the time average Vax of flow velocity of gas in the X-axis direction until the gas passes the position on the first bend 51 at the central angle $\phi$.

As illustrated in FIG. 3, Vax increases with $\phi$ and so does the component of the gas flowing orthogonally to the discharge direction (X-axis direction). The rate of change in Vax (gradient of the graph), however, starts decreasing at an accelerated pace when $\phi$ exceeds 90°. Vax then peaks at 0.72 with $\phi = 135°$ and thereafter decreases as $\phi$ increases. The peak value of Vax, 0.72 is lower than the average gas flow velocity V (Vax/V<1.0). That is, the inertial force of the gas in the X-axis direction is reduced. The average flow velocity Vax in the X-axis direction can be further reduced by setting $\phi$ to greater than 135°. From the foregoing, the inertial force reducing effect for the gas in the X-axis direction can be enhanced by setting the value of $\phi$ equal to or greater than 135°. The same also applies to the second bends 52.

The first and second bends 51 and 52 each arcuately extend with a central angle of greater than 90 degrees. This shifts the traveling direction of the gas in the second bend 52 from the X-axis direction and shifts again the traveling direction of the flow of the gas into the first bend 51 from the second connection end 51b from the X-axis direction. Moreover, a longer channel length of each of the first and second bends 51 and 52 can be ensured. Thus, the inertial force of the gas in the X-axis direction is further reduced, reducing the unevenness of the gas flowing through the first and second bends 51 and 52 in the X-axis direction. Thus, the unevenness of the flow of the gas from the second part 42 is prevented.

The curvature 1/R of the first bend 51 is the same as the curvature 1/R of the second bend 52. As a result, resistance to the flow of gas can be reduced at the connection between the first bend 51 and the second bend 52 (the second connection end 51b and the third connection end 52a). Thus, the X-axis directional inertial force acting on the flow of the gas from the second bend 52 to the second part 42 via the first bend 51 is reduced, and pressure loss of the gas is also reduced.

The tangent L3 to the fourth connection end 52b of the second bend 52 connected to the first part 41 extends in the discharge direction as with the first part 41. This can reduce the X-axis directional inertial force acting on the gas and pressure loss of the gas flowing from the first part 41 to the second part 42 via the first and second bends 51 and 52.

The discharge-side end 52c of the second bend 52 is farther in the discharge direction than the suction-side end 51c of the first bend 51. As a result, from the first part 41 to the second part 42, the gas flows in part of the first and second bends 51 and 52 oppositely (discharge direction) to the general travel direction (suction direction) in the flow channel 33. This can reduce the X-axis directional inertial force acting on the gas and the pressure loss of the gas flowing from the second bend 52 to the second part 42 via the first bend 51.

Figure 4:
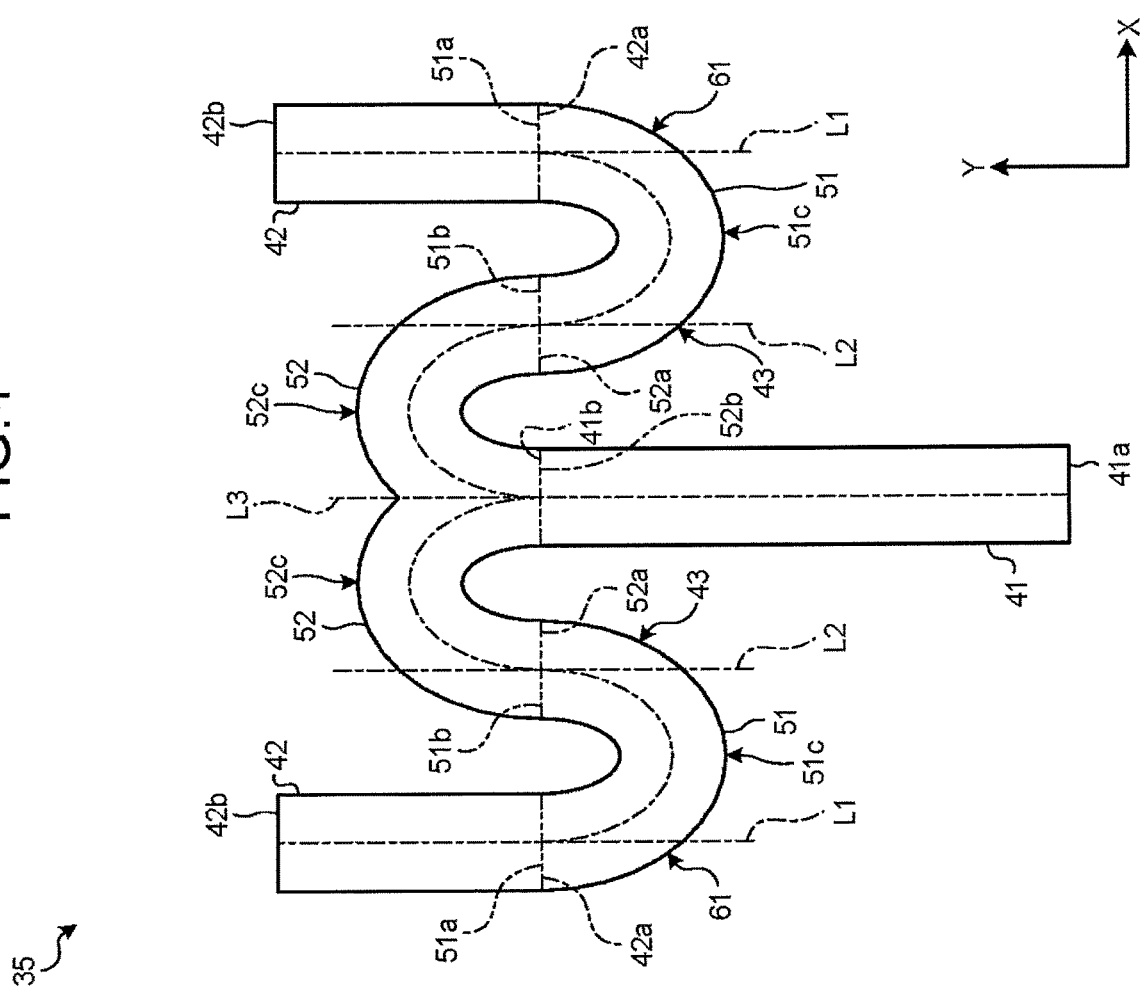
FIG. 4 is a plan view of a bifurcation according to a second embodiment.
Figure 5:
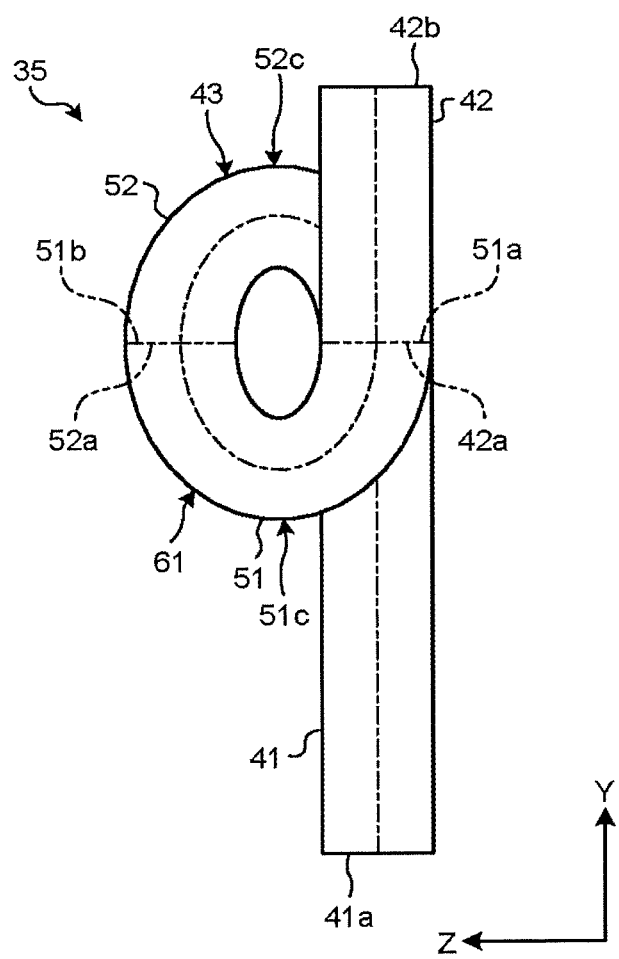
FIG. 5 is a side elevational view of the bifurcation according to the second embodiment.
Figure 6:
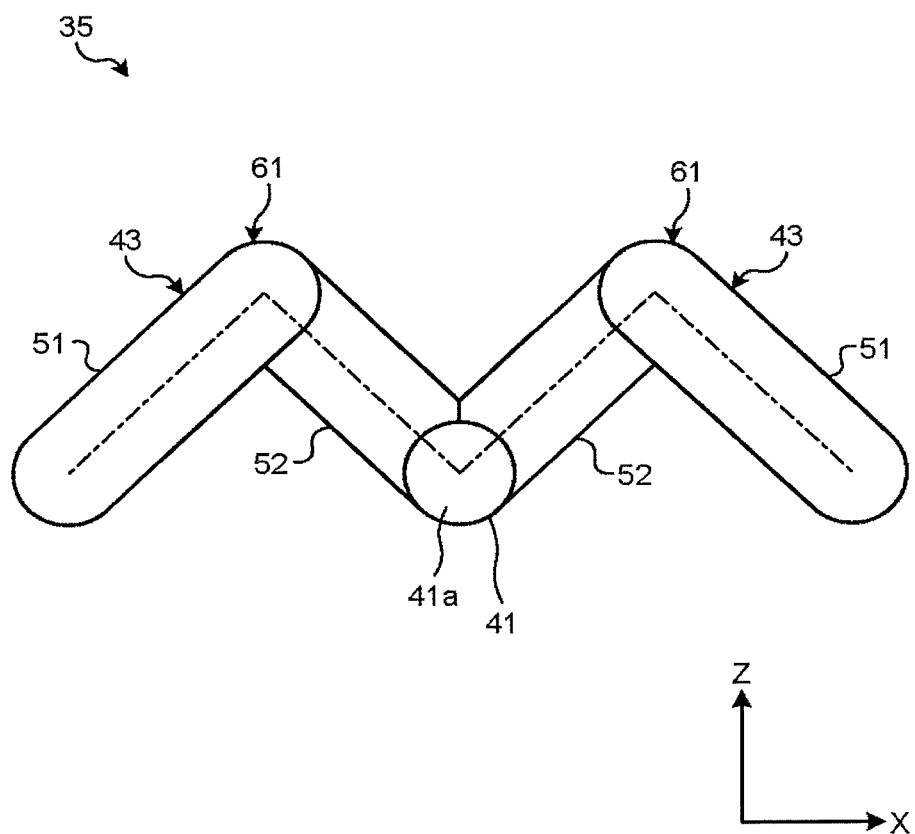
FIG. 6 is a front elevational view of the bifurcation according to the second embodiment.

The following describes a second embodiment with reference to FIGS. 4 to 6. In the following embodiments the elements having same or like functions as those described above are denoted by the same or like reference numerals and a description thereof may be omitted. The elements denoted by the same or like reference numerals do not necessarily have common functions and properties and may have different functions and properties according to the embodiments.

FIG. 4 is a plan view of a bifurcation 35 according to a second embodiment. FIG. 5 is a side elevational view of the bifurcation 35 according to the second embodiment. FIG. 6 a front elevational view of the bifurcation 35 according to the second embodiment. As illustrated in FIGS. 4 to 6, connections 43 in the second embodiment each include a spiral 61. The spiral 61 may be alternatively referred to as a swirl.

The spiral 61 includes a first bend 51 and a second bend 52. The first and second bends 51 and 52 in the second embodiment have the same shape as the shape of the first and second bends 51 and 52 in the first embodiment. The first and second bends 51 and 52 of the spiral 61 may have shapes different from the shape of the first and second bends 51 and 52 in the first embodiment. The first and second bends 51 and 52 in the second embodiment extend in different directions from the extending directions of the first and second bends 51 and 52 in the first embodiment, as described below.

As illustrated in FIG. 6, the first bend 51 of the spiral 61 extends obliquely crossing the X-axis, that is, goes further in the Z-axis direction as going further in the X-axis direction. From a second connection end 51b to a first connection end 51a of the first bend 51, for example, the first bend 51 extends further in a negative Z-axis direction (downward), as extending further in the X-axis direction.

The second bend 52 of the spiral 61 extends obliquely crossing the X-axis, that is, goes further in the Z-axis direction as going further in the X-axis direction. From a fourth connection end 52b to a third connection end 52a of the second bend 52, for example, the second bend 52 extends further in a positive Z-axis direction (upward), as extending further in the X-axis direction.

As described above, the first and second bends 51 and 52 each extend further in the Z-axis direction as extend further in the X-axis direction. Thus, the spiral 61 extends spirally in the X-axis direction. In other words, the first and second bends 51 and 52 of the spiral 61 extend while turning in the X-axis direction.

In the second embodiment, the X-axis directional component Vx of the gas at an average flow velocity V remains substantially constant, flowing through the spiral 61 including the first and second bends 51 and 52. The component Vx flows at a lower velocity than the average flow velocity V. Because of this, the X-axis directional inertial force of the gas is less likely to increase in the spiral 61. Thus, the flow of the gas can be inhibited from becoming uneven in the second part 42.

In a treatment apparatus 10 according to the second embodiment, the connections 43 each include the spiral 61 extending spirally and having the first and second bends 51 and 52. This three-dimensionally changes the traveling direction of the flow of the gas through the spiral 61. Thus, through the spiral 61 the X-axis directional component Vx of the gas flowing at the average flow velocity V is slowed in velocity from the average flow velocity V. This can inhibit an increase in the X-axis directional inertial force acting on the gas and pressure loss of the gas flowing from the second bend 52 to the second part 42 via the first bend 51. Additionally, the bifurcation 35 can be decreased in width in the X-axis direction, which can lead to downsizing the nozzle 13.

Figure 7:
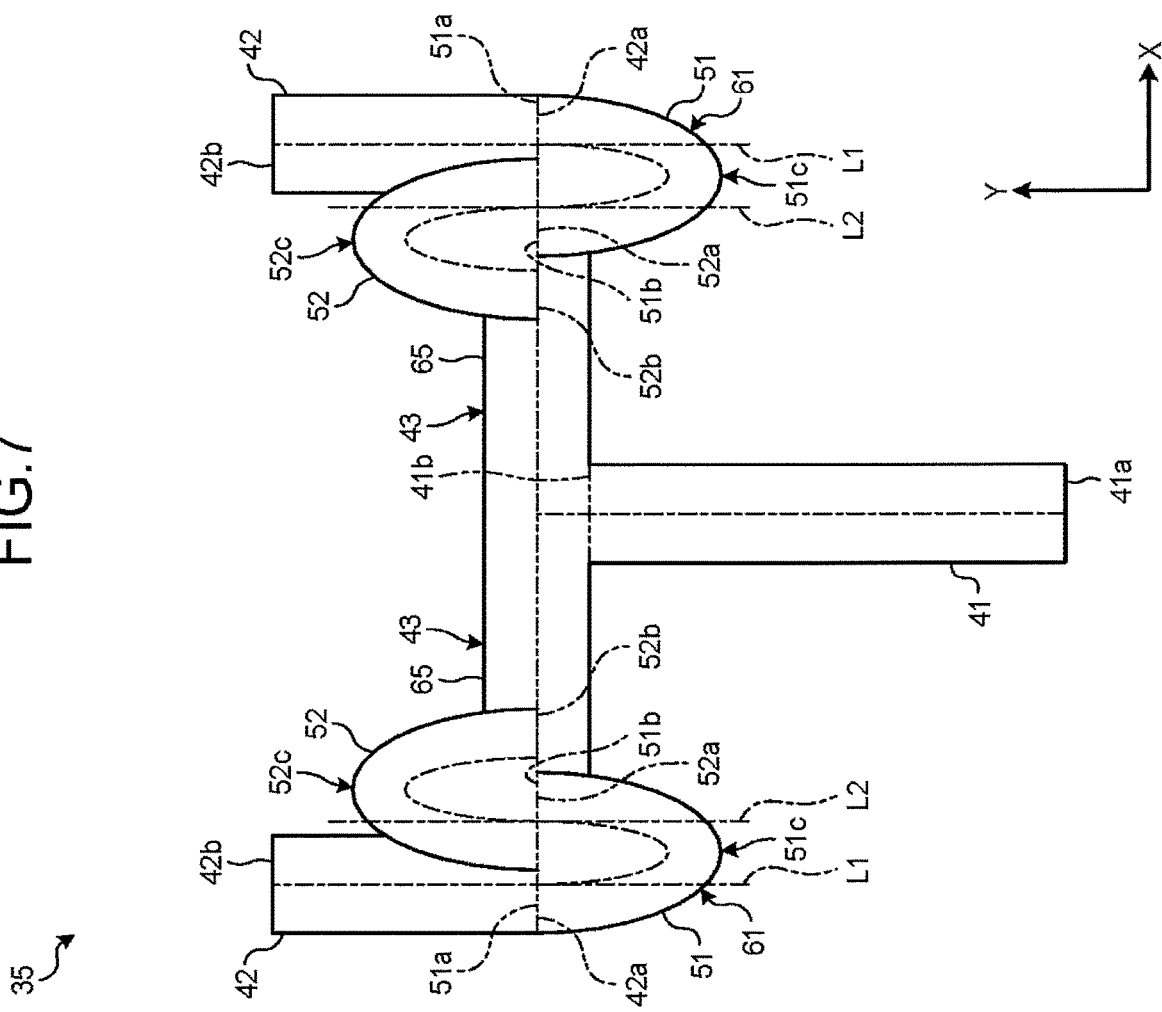
FIG. 7 is a plan view of a bifurcation according to a third embodiment.
Figure 8:
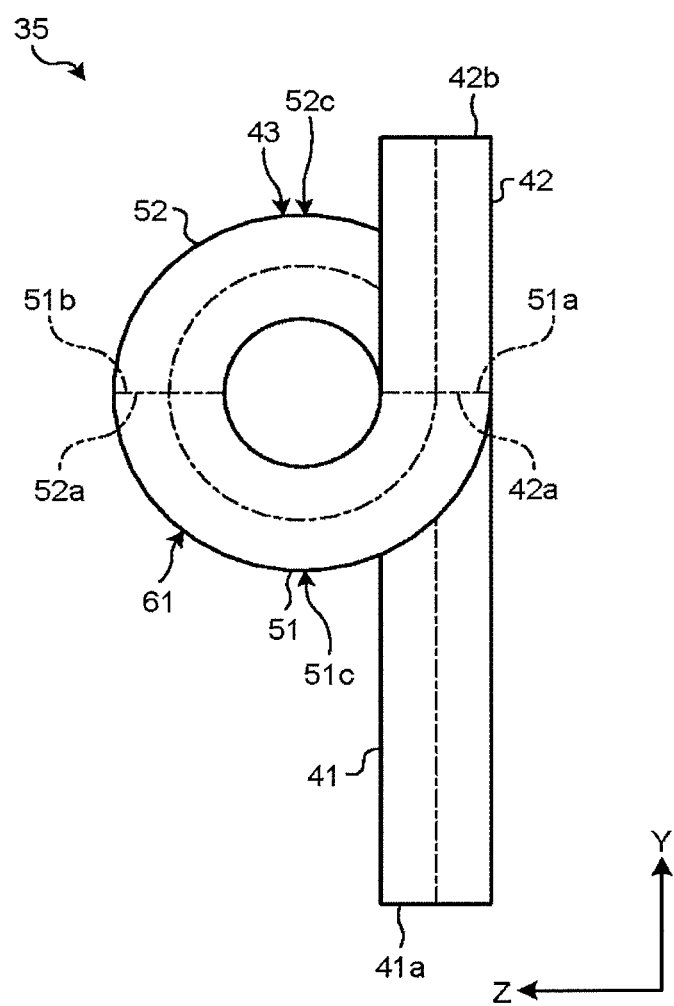
FIG. 8 is a side elevational view of the bifurcation according to the third embodiment.
Figure 9:
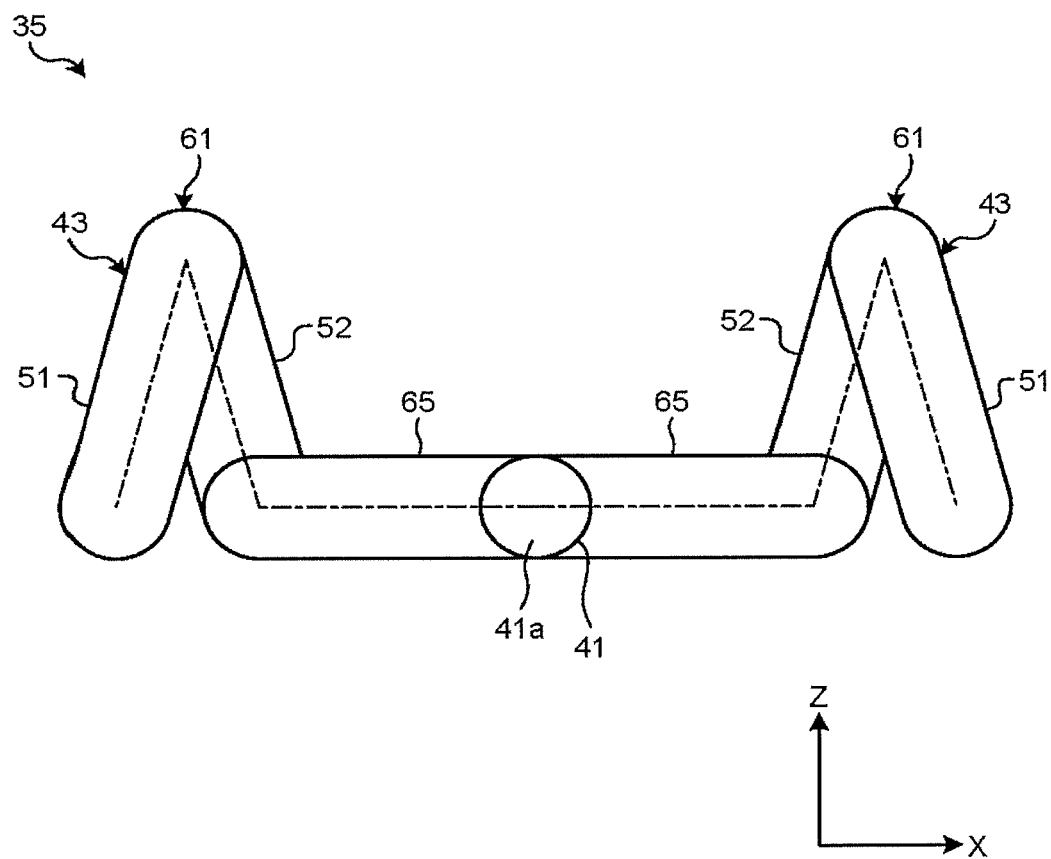
FIG. 9 is a front elevational view of the bifurcation according to the third embodiment.

The following describes a third embodiment with reference to FIGS. 7 to 9. FIG. 7 is a plan view of a bifurcation 35 according to the third embodiment. FIG. 8 is a side elevational view of the bifurcation 35 according to the third embodiment. FIG. 9 is a front elevational view of the bifurcation 35 according to the third embodiment. As illustrated in FIGS. 7 to 9, connections 43 in the third embodiment each include a straight part 65.

The straight part 65 lie between a first outlet end 41b of a first part 41 and a fourth connection end 52b of a second bend 52. That is, the straight part 65 connects the first outlet end 41b of the first part 41 and the fourth connection end 52b of the second bend 52.

The straight part 65 extends from the first outlet end 41b of the first part 41 in the X-axis direction. The straight part 65 may extend obliquely with respect to the X-axis. The straight part 65, while extending linearly, may include a curved extension, for example.

The connections 43 in the third embodiment each include a spiral 61 as with the connections 43 in the second embodiment. Thus, a first bend 51 and the second bend 52 each extend obliquely crossing the X-axis, that is, goes further in the Z-axis direction as going further in the X-axis direction.

While flowing through a flow channel 33, the X-axis directional inertial force occurs in the gas in the straight part 65. The spiral 61 including the first and second bends 51 and 52, however, works to slow the velocity of the X-axis directional component Vx of the gas at the average flow velocity V from the average flow velocity V. As a result, the X-axis directional inertial force of the gas is less likely to increase in the spiral 61. This can inhibit the flow of the gas from becoming uneven in second part 42.

A treatment apparatus 10 in the third embodiment includes the connections 43 that each include the straight part 65 that connects the first part 41 and the second bend 52. Thereby, a degree of freedom in the shape of the connections 43 can be enhanced.

Figure 10:
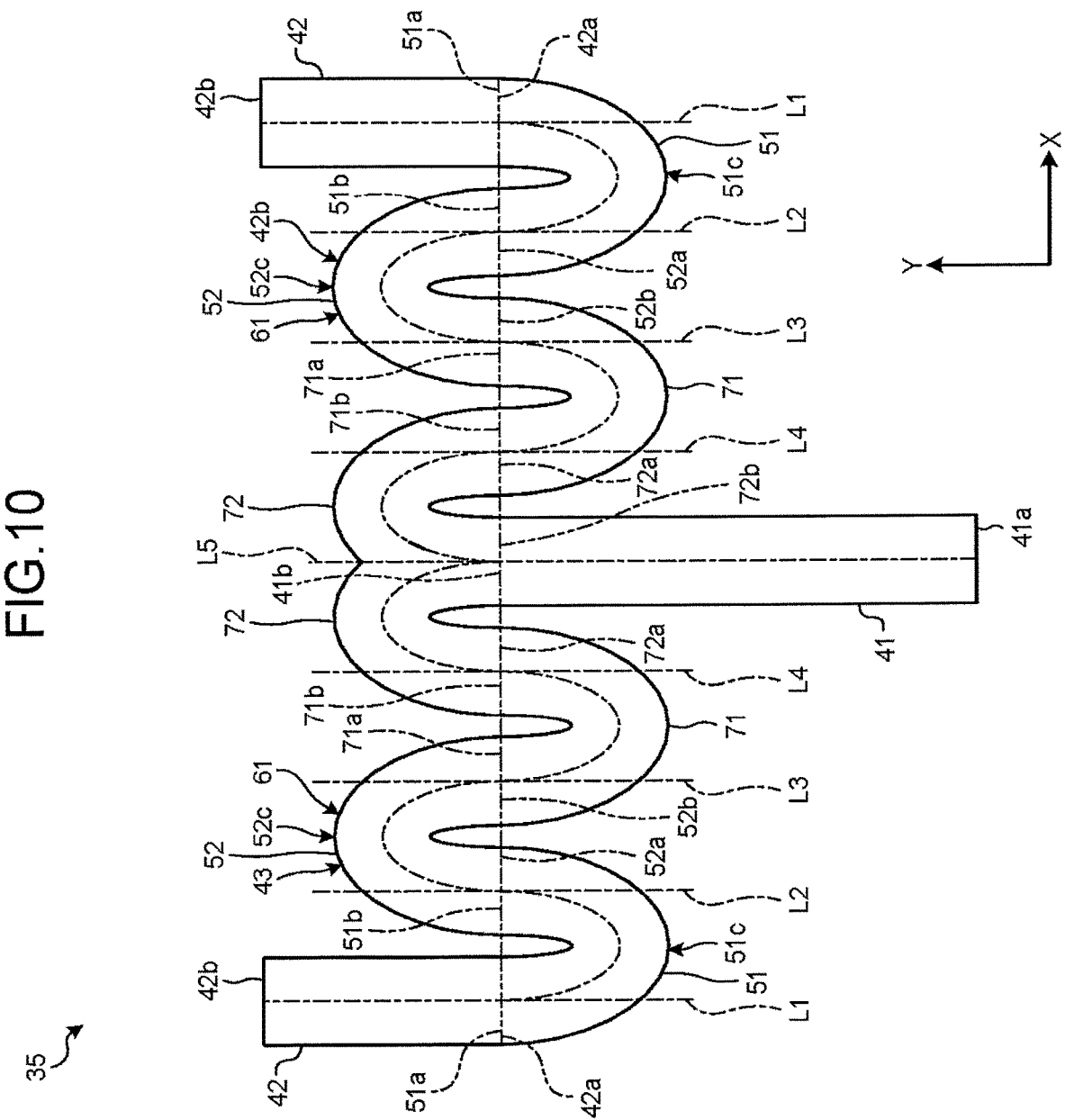
FIG. 10 is a plan view of a bifurcation according to a fourth embodiment.
Figure 11:
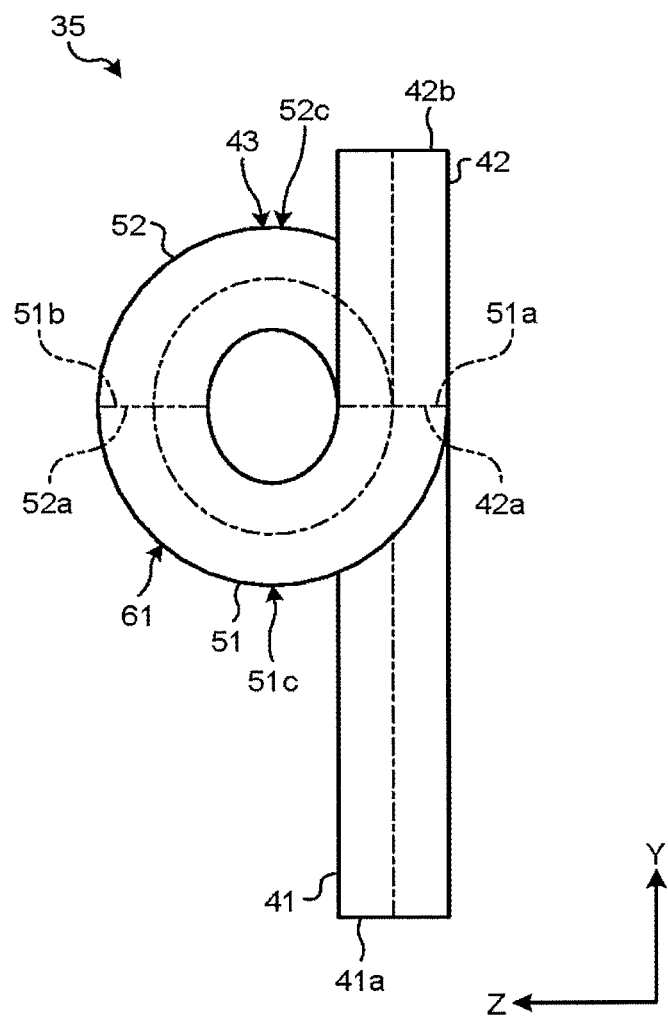
FIG. 11 is a side elevational view of the bifurcation according to he fourth embodiment.
Figure 12:
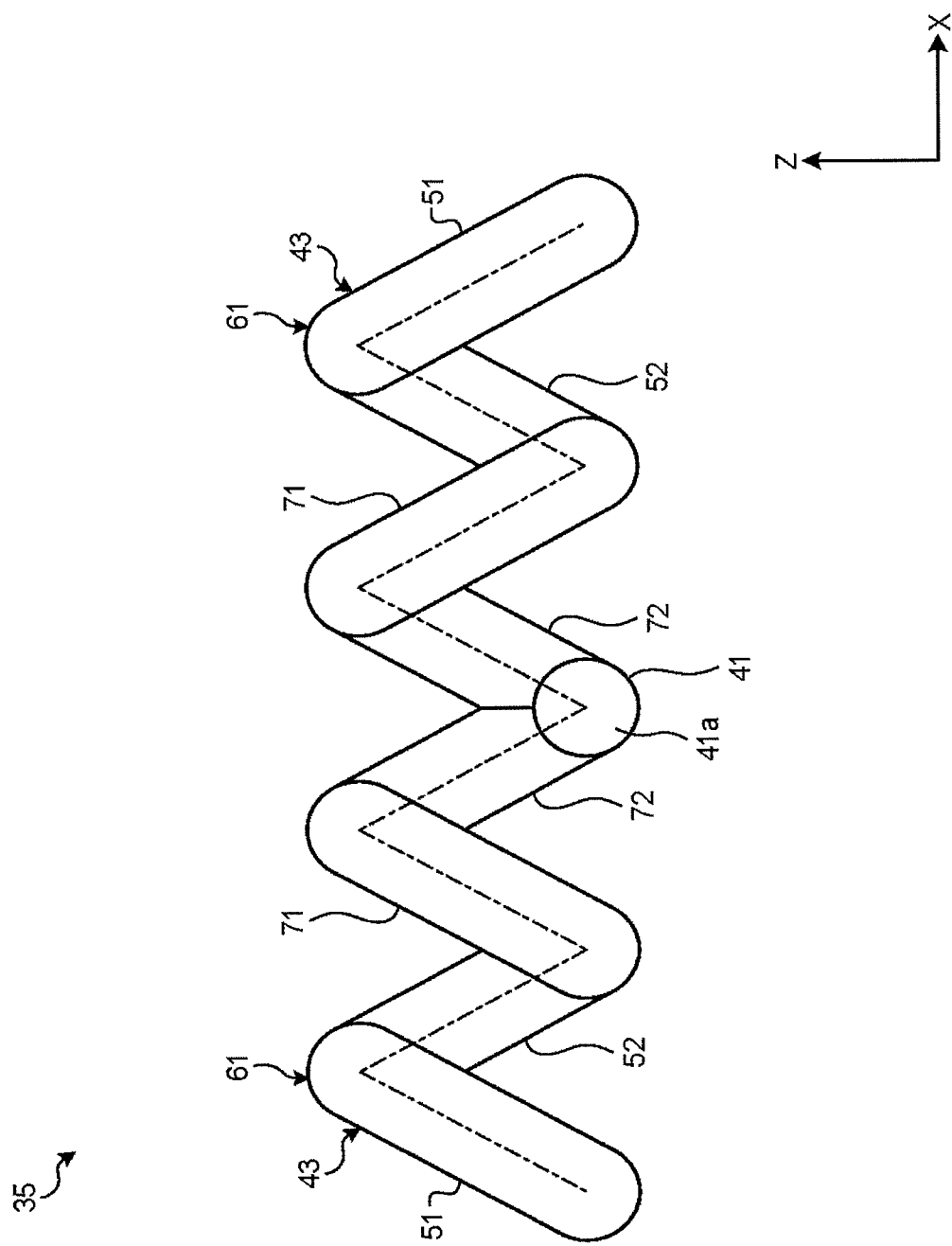
FIG. 12 is a front elevational view of the bifurcation according to the fourth embodiment.

The following describes a fourth embodiment with reference to FIGS. 10 to 12. FIG. 10 is a plan view of a bifurcation 35 according to the fourth embodiment. FIG. 11 is a side elevational view of the bifurcation 35 according to the fourth embodiment. FIG. 12 is a front elevational view of the bifurcation 35 according to the fourth embodiment. As illustrated in FIGS. 10 to 12, a spiral 61 in the fourth embodiment further includes a third bend 71 and a fourth bend 72.

The third and fourth bends 71 and 72 each lie between a first outlet end 41b of a first part 41 and a fourth connection end 52b of a second bend. That is, the third and fourth bends 71 and 72 each connect the first outlet end 41b of the first part 41 and the fourth connection end 52b of the second bend 52.

The third bend 71 has the same shape as the shape of a first bend 51. The third bend 71 may be shaped differently from the first bend 51. The third bend 71 is an arcuate extension having a radius of R. In other words, the third bend 71 is an arcuate extension having a curvature of 1/R. In the present embodiment, the radius and the curvature of the third bend 71 represent the radius and the curvature of the center of a cross section of the third bend 71 indicated by the dash-single-dot line.

The third bend 71 has a fifth connection end 71a and a sixth connection end 71b. The fifth connection end 71a is connected to the fourth connection end 52b of the second bend 52. At the fifth connection end 71a, the third bend 71 faces in the discharge direction. Thus, a tangent L3 to the fourth connection end 52b of the second bend 52 is to the same as the tangent L3 to the fifth connection end 71a of the third bend 71.

The sixth connection end 71b is on the opposite side of the fifth connection end 71a. A tangent L4 to the sixth connection end 71b of the third bend 71 extends in the discharge direction. That is, the extending direction of the tangent L4 to the sixth connection end 71b of the third bend 71 is the same as the extending direction of the tangent L3 to the fifth connection end 71a of the third bend 71.

The third bend 71 arcuately extends with a central angle of greater than 90 degrees. In the present embodiment, the third bend 71 arcuately extends with a central angle of 180 degrees. As a result, the fifth connection end 71a and the sixth connection end 71b face substantially in the same direction. Additionally, the tangent L3 and the tangent L4 extend in parallel with each other.

As illustrated in FIG. 12, the third bend 71 of the spiral 61 extends obliquely crossing the X-axis, that is, goes further in the Z-axis direction as going further in the X-axis direction. The third bend 71 extends in parallel with the first bend 51.

As illustrated in FIG. 10, the fourth bend 72 has the same shape as the shape of the second bend 52. The fourth bend 72 may be shaped differently from the second bend 52. The fourth bend 72 is an arcuate extension having a radius of R. That is, the fourth bend 72 is an arcuate extension having a curvature of 1/R. In the present embodiment, the radius and the curvature of the fourth bend 72 represent the radius and the curvature of the center of a cross section of the fourth bend 72 indicated by the dash-single-dot line.

The fourth bend 72 has a seventh connection end 72a and an eighth connection end 72b. The seventh connection end 72a is connected to the sixth connection end 71b of the third bend 71. At the seventh connection end 72a, the fourth bend 72 faces in the suction direction. Thus, the tangent L4 to the sixth connection end 71b of the third bend 71 is to the same as the tangent L4 to the seventh connection end 72a of the fourth bend 72.

The eighth connection end 72b is on the opposite side of the seventh connection end 72a. The eighth connection end 72b is connected with the first outlet end 41b of the first part 41. A tangent L5 to the eighth connection end 72b of the fourth bend 72 extends in the discharge direction. That is, the extending direction of the tangent L5 to the eighth connection end 72b of the fourth bend 72 is the same as the extending direction of the first part 41.

The fourth bend 72 arcuately extends with a central angle of greater than 90 degrees. In the present embodiment, the fourth bend 72 arcuately extends with a central angle of 180 degrees. As a result, the seventh connection end 72a and the eighth connection end 72b face substantially in the same direction. Additionally, the tangent L4 and the tangent L5 extend in parallel with each other.

As illustrated in FIG. 12, the fourth bend 72 in the spiral 61 extends obliquely crossing the X-axis, that is, goes further in the Z-axis direction as going further in the X-axis direction. The fourth bend 72 extends in parallel with the second bend 52.

The spiral 61 including the first through fourth bends 51, 52, 71, and 72 extends spirally. Thus, through the spiral 61, the X-axis directional component Vx of the flow of the gas at the average flow velocity V is slowed from the average flow velocity V. As a result, the X-axis directional inertial force of the gas is less likely to increase in the spiral 61. This can reduce unevenness in the flow of the gas in a second part 42.

In a treatment apparatus 10 according to the fourth embodiment, the spiral 61 further includes the third and fourth bends 71 and 72 between the first part 41 and the second bend 52. As such, the spiral 61 may have a spiral form that makes two or more complete turns, instead of the one having a central angle of 360 degrees and making one complete turn as in the second and third embodiments. This can ensure a longer channel length of the spiral 61, which further prevents the increase in the X-directional inertial force of the flow of the gas to the second part 42.

The connections 43 may each include at least one bend, such as the third and fourth bends 71 and 72, in addition to the first and second bends 51 and 52. The connections 43 may include bends including the first and second bends 51 and 52 to at least partially form a spiral or a parabola, for example.

Figure 13:
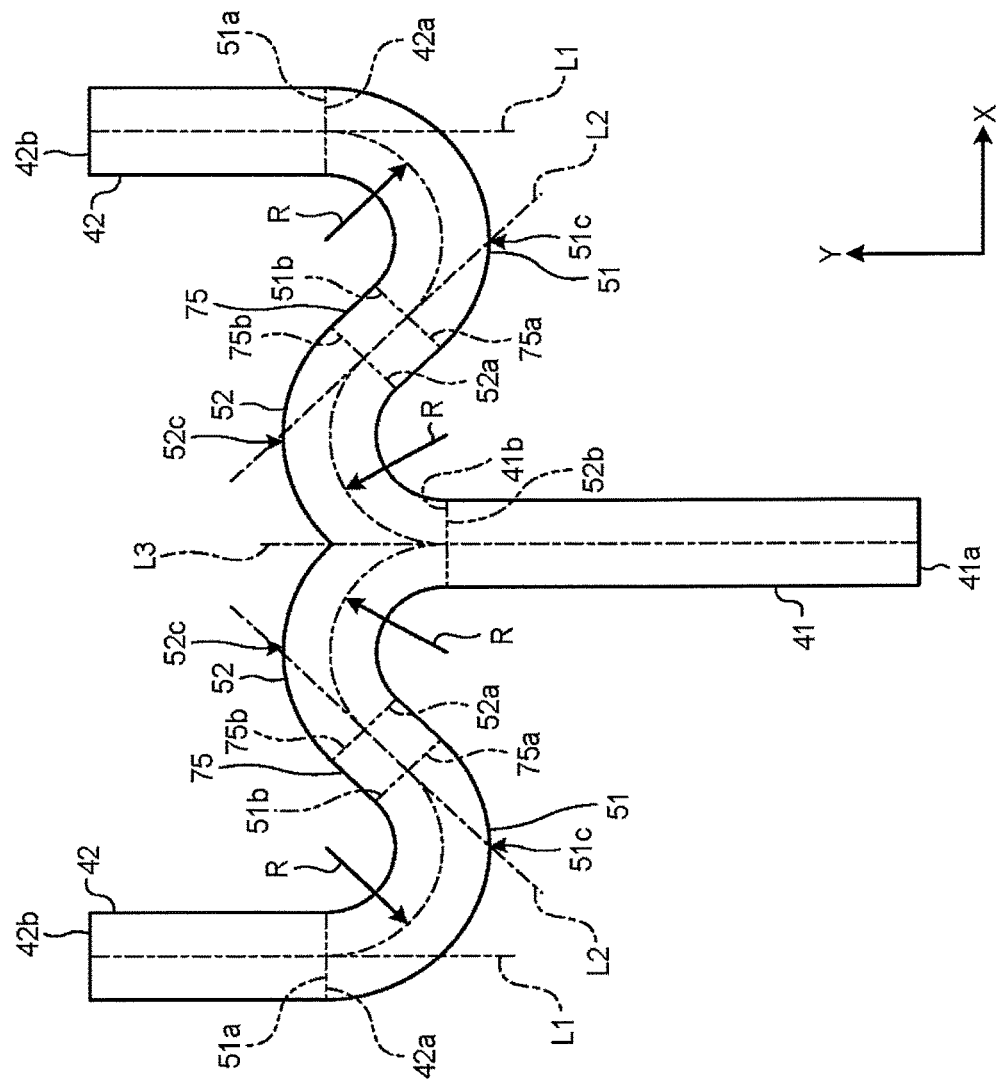
FIG. 13 is a plan view of a bifurcation according to a fifth embodiment.

The following describes a fifth embodiment with reference to FIG. 13. FIG. 13 is a plan view of a bifurcation 35 according to the fifth embodiment. As illustrated in FIG. 13, first and second bends 51 and 52 in the fifth embodiment each arcuately extend with a central angle of 135 degrees. Additionally, connections 43 each further include an interposer 75. The interposer 75 may be referred to also as a straight part, for example.

The interposer 75 lies between the first bend 51 and the second bend 52. The interposer 75 is a linear extension between a second connection end 51b of the first bend 51 and a third connection end 52a of the second bend 52. In other words, the interposer 75 extends from the second connection end 51b of the first bend 51 to the third connection end 52a of the second bend 52. The interposer 75 may include a curved extension.

The interposer 75 has a ninth connection end 75a and a tenth connection end 75b. The ninth connection end 75a is an exemplary fifth end. The tenth connection end 75b is an exemplary sixth end.

The ninth connection end 75a is connected to the second connection end 51b of the first bend 51. A tangent L2 to the second connection end 51b of the first bend 51 extends in the same direction as the interposer 75 extends.

The tenth connection end 75b is connected to the third connection end 52a of the second bend 52. The tangent L2 to the third connection end 52a of the second bend 52 extends in the same direction as the interposer 75 extends.

The interposer 75 has a length shorter than the radius R of the first bend 51. The length of the interposer 75 is shorter than the radius R of the second bend 52. The length of the interposer 75 is illustrative only and not limiting.

In a treatment apparatus 10 according to the fifth embodiment, the interposer 75 lie between the first bend 51 and the second bend 52. The tangent L2 to the second connection end 51b of the first bend 51 connected to the interposer 75 extends in the same direction as the interposer 75 extends. The tangent L2 to the third connection end 52a of the second bend 52 connected to the interposer 75 also extends in the same direction as the interposer 75 extends. This arrangement prevents pressure loss of the flow of the gas from the second bend 52 to a second part 42 via the first bend 51.

Additionally, with the interposer 75 added, the degree of designing freedom of the flow channel 33 can be enhanced.

The length of the interposer 75 is shorter than the radius R of the first bend 51. This results in further shortening the length of the interposer 75, which prevents the increase in the X-axis directional inertial force of the gas in the interposer 75.

Figure 14:
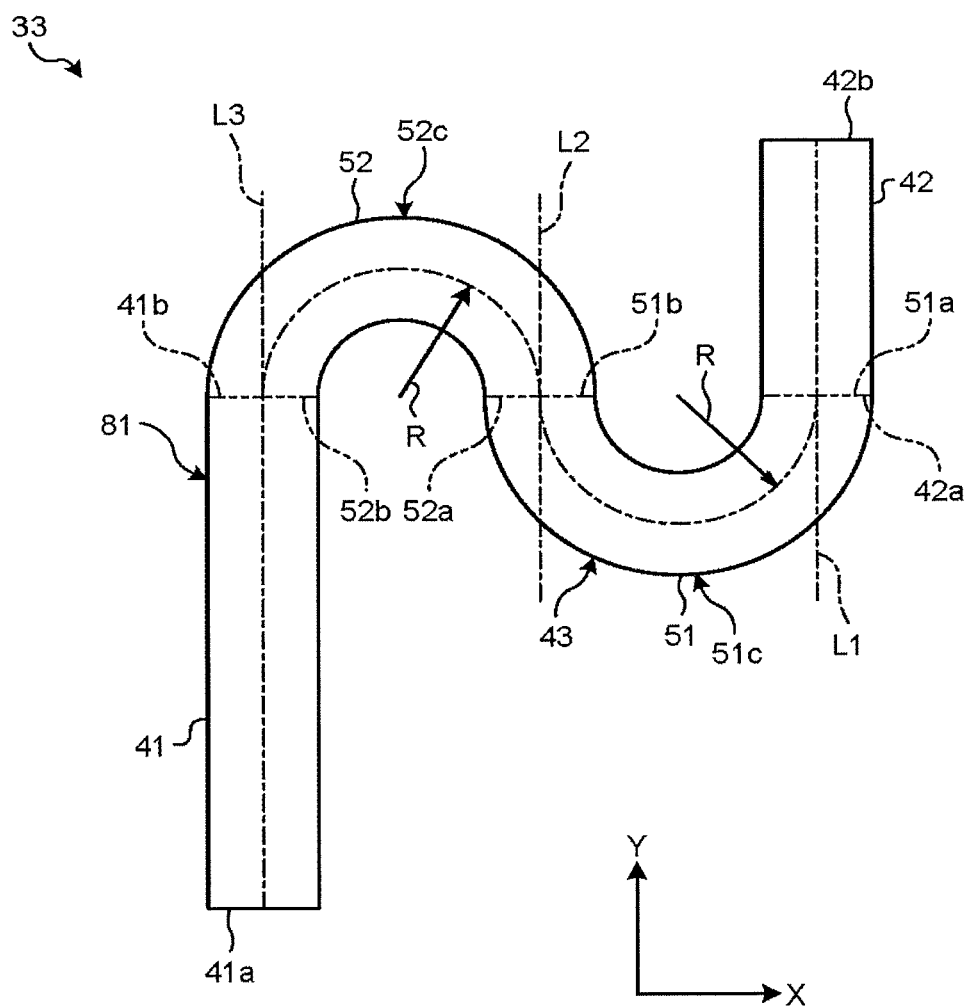
FIG. 14 is a plan view of part of a flow channel according to a sixth embodiment.

The following describes a sixth embodiment with reference to FIG. 14. FIG. 14 is a plan view of part of a flow channel 33 according to the sixth embodiment. As illustrated in FIG. 14, the flow channel 33 further includes a shifter 81.

The shifter 81 includes, as with the bifurcation 35 in the first embodiment, a first part 41, a second part 42, and a connection 43. Whereas the bifurcation 35 includes the multiple second parts 42 and the multiple connections 43, the shifter 81 includes one second part 42 and one connection 43.

Flowing through the flow channel 33, the gas flows through the shifter 81 in the following manner, for example. The flow of the gas through the shifter 81 to be described below is illustrative only and not limiting.

The gas first flows from a first inlet end 41a of the first part 41 of the shifter 81 toward a first outlet end 41b. From the first outlet end 41b, the gas flows into a fourth connection end 52b of one second bend 52 connected to the first cutlet end 41b.

The first part 41 extends in the same direction as a tangent L3 to the fourth connection end 52b of the second bend 52. Because of this, the gas flows smoothly from the first part 41 into the second bend 52. In other words, the gas is less likely to collide with the inner face of the flow channel 33 at the connection between the first part 41 and the second bend 52, and can flow along the second bend 52. This can inhibit the increase in the pressure loss of the gas at the connection between the first part 41 and the second bend 52.

The gas flows from the fourth connection end 52b of the second bend 52 toward a third connection end 52a. From the fourth connection end 52b to a discharge-side end 52c of the second bend 52, the gas moves in the discharge direction as moving in the X-axis direction. From the discharge-side end 52c to the third connection end 52a, the gas moves in the suction direction as moving in the X-axis direction.

The gas flows from the third connection end 52a of the second bend 52 into a second connection end 51b of a first bend 51. The gas flows from the second connection end 51b of the first bend 51 to a first connection end 51a. The gas, while flowing from the second connection end 51b to a suction-side end 51c of the first bend 51, moves in the suction direction as moving in the X-axis direction. The gas, while flowing from the suction-side end 51c to the first connection end 51a, moves in the discharge direction as moving in the X-axis direction.

The gas flows from the first connection end 51a of the first bend 51 into a second inlet end 42a of the second part 42. The gas then flows from the second inlet end 42a of the second part 42 to a second outlet end 42b.

Through the connection 43, the gas flows from the first outlet end 41b of the first part 41 toward the second inlet end 42a of the second part 42 that is spaced apart from the first part 41 in the X-axis direction. That is, through the connection 43, the gas moves in the X-axis direction as a whole. Through the connection 43, however, the component Vx of the gas varies while moving in the X-axis direction. For example, the component Vx decreases as the gas moves from the discharge-side end 52c of the second bend 52 to the third connection end 52a. The component Vx further decreases as the gas moves from the suction side-end 51c of the first bend 51 to the first connection end 51a.

Because the component Vx varies, the X-axis directional inertial force of the gas flowing through the connection 43 does not likely increase. As a result, the gas is distributed substantially uniformly in the X-axis direction in the second part 42. That is, the unevenness of the flow of the gas in the second part 42 is prevented.

As illustrated in the sixth embodiment, the first part 41, the second part 42, and the connection 43 may be provided not only in the bifurcation 35 of the flow channel 33 but also in any other part such as the shifter 81. Thereby, the flow of the gas moves in parallel in the X-axis direction and the parallel-moving gas is prevented from becoming uneven.

In the embodiments described above, the gas flows from the first part 41 to the second parts 42 and is discharged from the first openings 31. In the nozzle 13, however, the gas may flow from the second parts 42 to the first part 41. In this case, the nozzle 13 can suction fluid evenly from the first openings 31.

According to at least one of the above embodiments, a connection in a flow channel connects a first part and a second part and includes a first bend and a second bend. The first bend arcuately extends with a first curvature and a central angle of greater than 90 degrees. The first bend has a first end connected to the second part and a second end opposite to the first end. The second bend arcuately extends with a second curvature and has a third end connected to the second end of the first bend. A tangent to the first end of the first bend extends in a first direction and a tangent to the second end of the first bend is equal to a tangent to the third end of the second bend. The foregoing arrangement can prevent unevenness of the fluid.

While certain embodiments have been described, these embodiments have been presented by way of example only and are not intended to limit the scope of the inventions. Indeed, the novel embodiments described herein may be embodied in a variety of other forms; furthermore, various omissions, substitutions, and changes in the form of the embodiments described herein may be made without departing from the spirit of the invention. The accompanying claims and their equivalents are intended to cover such forms or modifications as would fall within the scope and spirits of the invention.

Then invention claimed is:

1. A flow channel structure comprising a member that comprises a flow channel, the flow channel comprising:
    a first bifurcation; and
    a plurality of second bifurcations, wherein
    the first bifurcation and the second bifurcations each comprise:
        a first part that extends in a first direction;
        a plurality of second parts having a same channel length and each extending in the first direction; and
        a plurality of connections, each of which connects the first part and a corresponding one of the second parts, and includes a first bend and a second bend,
    the first bend arcuately extends with a first curvature and a central angle of greater than 90 degrees, and has a first end connected to the corresponding one of the second parts and a second end opposite to the first end,
    the second bend arcuately extends with a second curvature, and has a third end and a fourth end, the third end connected to the second end of the first bend, the fourth end opposite to the third end and connected to the first part, a tangent to the first end of the first bend extends in a same direction as the corresponding one of the second parts extends, a tangent to the second end of the first bend is the same as a tangent to the third end of the second bend, a tangent to the fourth end of the second bend extends in the first direction, the connections have a same channel length, the second parts of the first bifurcation are connected with the first parts of the different second bifurcations, respectively, and the tangent to the first end of the first bend of the first bifurcation is the same as the tangent to the fourth end of the second bend of the second bifurcations, the first end connected with the fourth end through the first part and the corresponding one of the second parts.

2. The flow channel structure according to claim 1, wherein the second bend arcuately extends with a central angle of greater than 90 degrees.

3. The flow channel structure according to claim 1, wherein the first curvature is same as the second curvature.

4. The flow channel structure according to claim 1, wherein an end of the second bend in the first direction is farther in the first direction than an end of the first bend in an opposite direction of the first direction.

5. The flow channel structure according to claim 1, wherein the connections each include a helix that includes the first bend and the second bend and extends helically.

6. The flow channel structure according to claim 1, wherein the connections each further include an interposer between the first bend and the second bend, the interposer having a fifth end connected to the second end of the first bend and a sixth end connected to the third end of the second bend, the interposer extending from the second end of the first bend to the third end of the second bend, a tangent to the second end of the first bend extends in a same direction as the interposer extends, and a tangent to the third end of the second bend extends in a same direction as the interposer extends.

7. The flow channel structure according to claim 6, wherein the interposer has a length shorter than a radius of the curvature of the first bend.

8. The flow channel structure according to claim 1, wherein the second bend arcuately extends with a central angle of greater than 135 degrees.

9. A treatment apparatus comprising:

the flow channel structure according to claim 1 that comprises a plurality of openings connected with the second parts of the second bifurcations; and a tank that contains a fluid, wherein the first bifurcation bifurcates the fluid that is supplied to the first pail thereof from the tank into the second parts thereof, the second bifurcations each bifurcate the fluid that is supplied to the first part thereof from a corresponding one of the second parts of the first bifurcation into the second parts thereof, and the flow channel structure discharges the fluid to outside from the openings.

\* \* \* \* \*